US010054979B1

(12) United States Patent
Liao et al.

(10) Patent No.: US 10,054,979 B1
(45) Date of Patent: Aug. 21, 2018

(54) PLACEMENT OF GROUND VIAS FOR HIGH-SPEED DIFFERENTIAL SIGNALS

(71) Applicant: DELL PRODUCTS, L.P., Round Rock, TX (US)

(72) Inventors: Chun-Lin Liao, Taipei (TW); Ching Huei Chen, Pingtung (TW); Bhyrav M. Mutnury, Austin, TX (US); Siang Chen, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/627,018

(22) Filed: Jun. 19, 2017

(51) Int. Cl.
| H05K 7/00 | (2006.01) |
| H05K 5/00 | (2006.01) |
| G06F 1/16 | (2006.01) |
| H05K 1/11 | (2006.01) |
| H05K 1/02 | (2006.01) |
| H05K 3/40 | (2006.01) |

(52) U.S. Cl.
CPC ............. *G06F 1/16* (2013.01); *H05K 1/0245* (2013.01); *H05K 1/115* (2013.01); *H05K 3/4038* (2013.01)

(58) Field of Classification Search
CPC .................................................... H05K 1/0251
USPC ......................................................... 361/736
See application file for complete search history.

(56) References Cited

U.S. PATENT DOCUMENTS

| 5,955,704 | A | 9/1999 | Jones et al. |
| 6,743,985 | B1 | 6/2004 | Greim et al. |
| 7,468,894 | B2 | 12/2008 | Bibee |
| 7,676,920 | B2 | 3/2010 | Farkas et al. |
| 2003/0102151 | A1* | 6/2003 | Hirose ................. H05K 1/0224 174/250 |
| 2008/0158841 | A1* | 7/2008 | Inagaki .................. H01G 4/224 361/782 |
| 2010/0259338 | A1 | 10/2010 | Jow et al. |
| 2016/0316562 | A1 | 10/2016 | Mundt et al. |
| 2017/0013716 | A1 | 1/2017 | Chandra et al. |
| 2017/0047686 | A1 | 2/2017 | Wig |

* cited by examiner

Primary Examiner — Jerry Wu
(74) Attorney, Agent, or Firm — Isidore PLLC

(57) ABSTRACT

A circuit board assembly of an information handling system has an adjacent pair of vias that carry differential communication signal through printed circuit board (PCB) substrates. Pairs of ground vias each having a first ground via and a second ground via placed symmetrically on both sides of a virtual ground plane that passes between the adjacent pair of vias. Ground vias are placed at a substantially identical radius from a respective one of the adjacent pair of vias that is on the same side of the virtual ground plane. First ground via(s) are annularly spaced substantially equally from each other and from a pair of reference points on the virtual ground plane that are each radially spaced from both of the adjacent pair of vias by the substantially identical radius. The second ground via(s) are annularly spaced from each other and the pair of reference points.

17 Claims, 11 Drawing Sheets

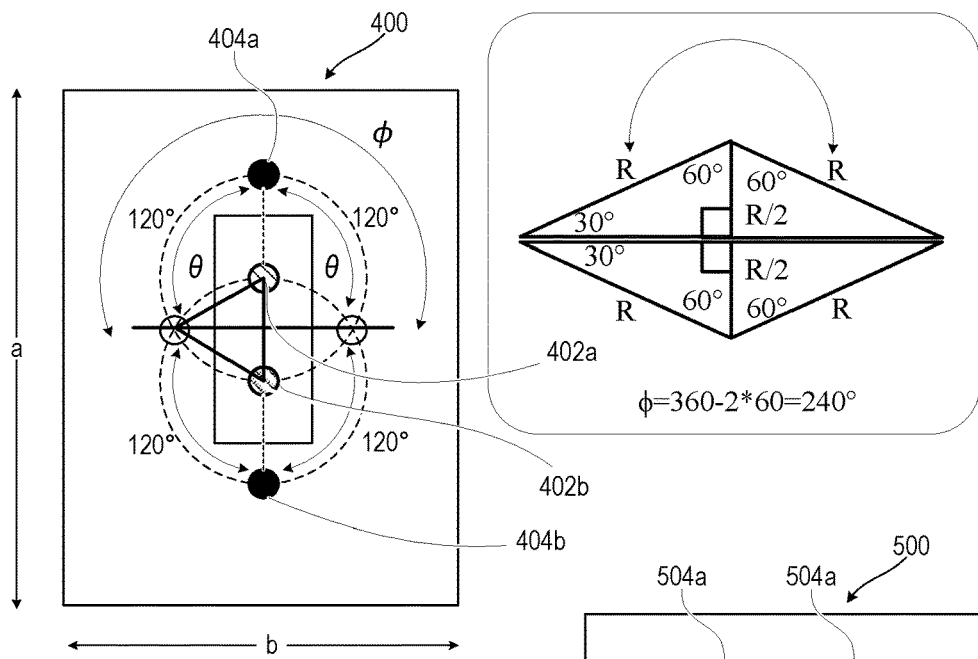
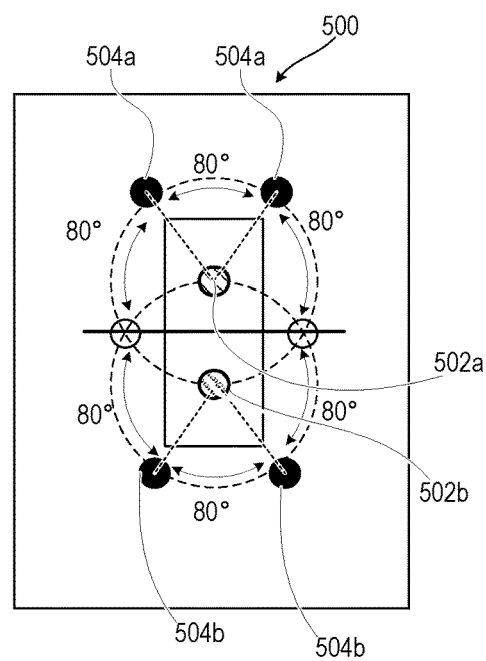
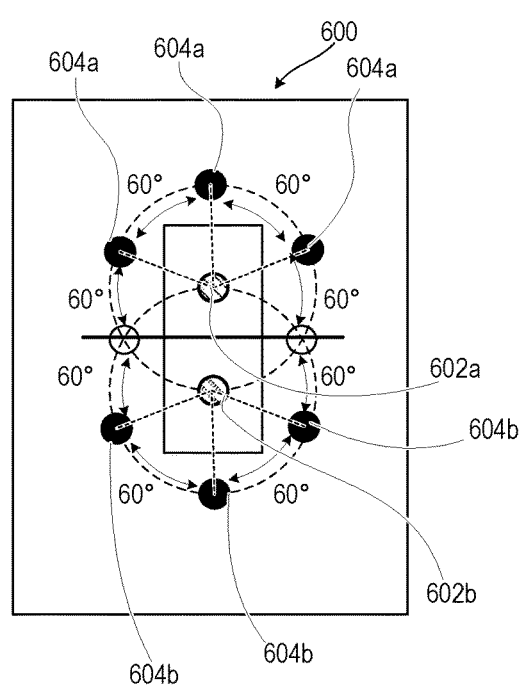
FIG. 4
FIG. 5
FIG. 6

PLACEMENT OF GROUND VIAS FOR HIGH-SPEED DIFFERENTIAL SIGNALS

BACKGROUND

1. Technical Field

The present disclosure relates in general to circuit board assemblies in an information handling system (IHS), and more particularly to communication signal vias between printed circuit board (PCB) substrates of a circuit board assembly in an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

In high speed IHS design, via structures play an important role in printed circuit board (PCB) circuit wiring. The vias connect traces and functional components from one layer in a PCB to another layer. For example, high speed signals maybe required to transition between layers at: (i) an alternating current (AC) coupling capacitor; (ii) a ball grid array (BGA) surface mount pad; and (iii) a connector. These high speed signal transitions need high speed vias, and more specifically differential signal vias carried by an adjacent pair of vias. In addition to high-speed signal vias, ground (GND) transition vias are needed to ensure good current return path. Without these GND transition vias, differential transmission lines cannot maintain good signal integrity. The signal via structures result in crosstalk and impedance mismatches that impact the signal quality of a high speed communication bus. As the data rates of high speed buses increase, for example to 25 Gbps, 32 Gbps or beyond, subtle effects from via crosstalk and reflections are getting magnified. These via structures need to be optimized to achieve a best achievable signal quality within certain physical and economical limits.

BRIEF SUMMARY

In accordance with the teachings of the present disclosure, a circuit board assembly includes more than one printed circuit board (PCB) substrate. An adjacent pair of vias carry a differential communication signal through the PCB substrates. The adjacent pair of vias define an axis. The adjacent pair of vias define a bisecting plane orthogonal to the PCB substrates and passing through the axis of the adjacent pair of vias. The adjacent pair of vias define a virtual ground plane orthogonally intersecting the bisecting plane at a point that is substantially equidistant to each of the pair of adjacent vias. The virtual ground plane is orthogonal to the more than one PCB substrate. The circuit board assembly includes pair(s) of ground vias. Each pair of ground vias has a first ground via and a second ground via that are placed symmetrically on both sides of the virtual ground plane. The first and second ground vias are placed at a substantially identical radius from a respective one of the adjacent pair of vias that is on the same side of the virtual ground plane. The first ground via(s) are annularly spaced substantially equally from each other and from a pair of reference points on the virtual ground plane. The pair of reference points are each radially spaced from both vias of the adjacent pair of vias by the substantially identical radius. The second ground via(s) are annularly spaced from each other and the pair of reference points.

In accordance with embodiments of the present disclosure, an information handling system (IHS) has a circuit board assembly and a functional component. The circuit board assembly includes PCB substrates. An adjacent pair of vias carry a differential communication signal through the PCB substrates. The adjacent pair of vias define an axis. The adjacent pair of vias define a bisecting plane orthogonal to the PCB substrates and that passes through the axis of the adjacent pair of vias. The adjacent pair of vias define a virtual ground plane orthogonally intersecting the bisecting plane at a point that is substantially equidistant to each of the pair of adjacent vias. The virtual ground plane is orthogonal to the more than one PCB substrate. The circuit board assembly includes pair(s) of ground vias. Each pair has a first ground via and a second ground via that are placed symmetrically on both sides of the virtual ground plane. The first and second ground vias are placed at a substantially identical radius from a respective one of the adjacent pair of vias that is on the same side of the virtual ground plane. The first ground via(s) are annularly spaced substantially equally from each other and from a pair of reference points on the virtual ground plane. The pair of reference points are each radially spaced from both of the adjacent pair of vias by the substantially identical radius. The second ground via(s) are annularly spaced from each other and the pair of reference points. The functional component is electrically coupled to the adjacent pair of vias and is capable of performing at least one of: (i) transmitting; and (ii) receiving the differential communication signal.

According to illustrative embodiments of the present disclosure, a method is provided of selectively locating at least one pair of ground vias around an adjacent pair of differential vias. In one or more embodiments, the method includes establishing a virtual ground plane equidistant between each of the adjacent pair of differential vias. The method includes determining a pair of reference points on the virtual ground plane, wherein the pair of reference points are intersections of a circle centered at each of the pair of differential vias and the virtual ground plane. The method includes locating, at a radial distance from each of the adjacent pair of differential vias and annularly spaced at substantially equal angular distance between the pair of reference points, at least one ground via.

According to illustrative embodiments of the present disclosure, a method includes forming, by an automated manufacturing system, via holes through PCB substrates. The method includes stacking the PCB substrates in a stack having a top surface and a bottom surface. The automated manufacturing system forms, in two of the via holes, an adjacent pair of vias that carry a differential communication signal through the more than one PCB substrate. The adjacent pair of vias define: (i) an axis; (i) a bisecting plane orthogonal to the more than one PCB substrate and that passes through axis of the adjacent pair of vias; and (iii) a virtual ground plane orthogonally intersecting the bisecting plane at a point that is substantially equidistant to each of the pair of adjacent vias. The virtual ground plane is orthogonal to the more than one PCB substrate. The method includes forming, in respective via holes, one or more pairs of ground vias. Each pair has a first ground via and a second ground via placed symmetrically on both sides of the virtual ground plane. The first and second ground vias are placed at a substantially identical radius from a respective one of the adjacent pair of vias that is on the same side of the virtual ground plane. The first ground via(s) are annularly spaced from each other and from a pair of reference points on the virtual ground plane that are each radially spaced from both of the adjacent pair of vias by a substantially identical radius. The second ground via(s) are annularly spaced from each other and the pair of reference points.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 4 illustrates a top view of an example adjacent pair of vias that carry a differential communication signal having a return current path provided by one pair of ground vias, according to one or more embodiments;

FIG. 5 illustrates a top view of an example adjacent pair of vias that carry a differential communication signal having a return current path provided by two pairs of ground vias, according to one or more embodiments;

FIG. 6 illustrates a top view of an example adjacent pair of vias that carry a differential communication signal having a return current path provided by three pairs of ground vias, according to one or more embodiments;

DETAILED DESCRIPTION

Figure 1:
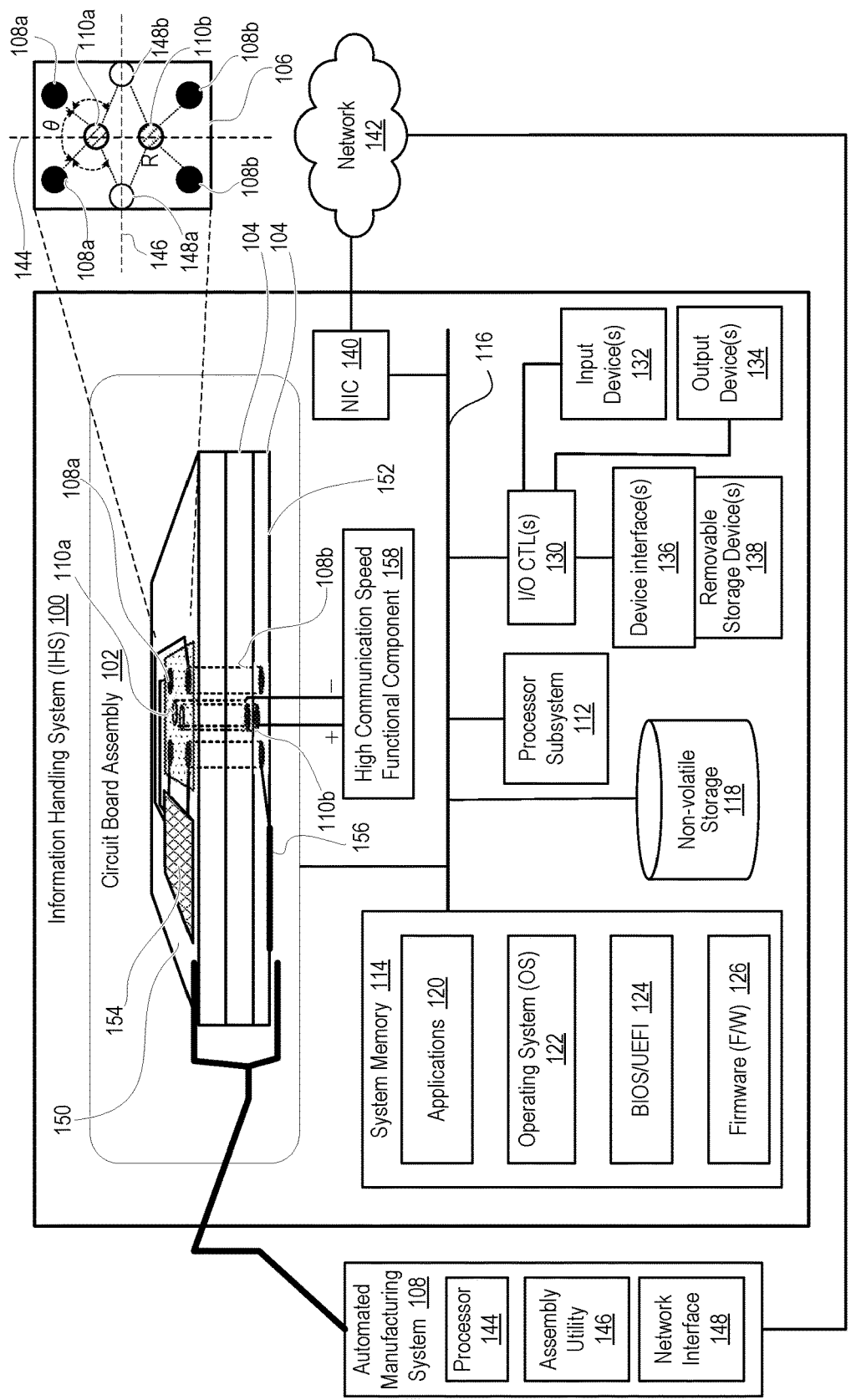
FIG. 1 illustrates a block diagram representation of an example information handling system (IHS) having a circuit board with a ground via and a pair of differential signal vias, according to one or more embodiments.

According to aspects of the present innovation, a circuit board assembly of an information handling system (IHS) optimizes placement of surrounding ground vias to achieve improved signal integrity at next generation communication speeds. The circuit board assembly has an adjacent pair of vias that carry differential communication signal through printed circuit board (PCB) substrates. Pair(s) of ground vias each having a first ground via and a second ground via are placed symmetrically on both sides of a virtual ground plane that passes between the adjacent pair of vias. Ground vias are placed at a substantially identical radius from a respective one of the adjacent pair of vias that is on the same side of the virtual ground plane. First ground via(s) are annularly spaced substantially equally from each other and from a pair of reference points on the virtual ground plane that are each radially spaced from both of the adjacent pair of vias by the substantially identical radius. The second ground via(s) are annularly spaced from each other and the pair of reference points.

The present disclosure provides a method and apparatus for optimized electrical performance using high speed signal transition vias. In particular, the method and apparatus minimizes reflections and improves loss by symmetrically positioning the ground (GND) vias. The improved performance enables reducing the number of GND vias. The reduced number of GND vias in turn reduces the required size of circuit board assembly, enabling increased density of functional components of an IHS. Using a minimal number of GND vias also facilitates layout design of traces and connections. The required number of GND vias can be analytically determined based upon the communication speed requirement. The method and apparatus also reduces near and far end crosstalk for improved signal integrity.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example information handling system (IHS) 100 having a circuit board assembly 102 of a stack of printed circuit board (PCB) substrates 104. The circuit board assembly 102 has symmetrically placed arrangement 106 of first and second ground vias 108*a*-108*b* that surround two adjacent signal vias 110*a*-110*b* that carry a differential communication signal. Placement of the ground vias 108*a*-108*b* improves signal integrity for next generation system speeds. Within the general context of IHS s, the IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 1, IHS 100 has a processor subsystem 112 that is coupled to system memory 114 via system interconnect 116. System interconnect 116 can be interchangeably referred to as a system bus, in one or more embodiments. Also coupled to system interconnect 116 is non-volatile storage (e.g., a non-volatile random access memory (NVRAM) storage 118, within which can be stored one or more software and/or firmware modules and one or more sets of data that can be utilized during operations of management IHS 100. These one or more software and/or firmware modules can be loaded into system memory 114 during operation of management IHS 100. Specifically, in one embodiment, system memory 114 can include therein a plurality of such modules, including one or more of application(s) 120, operating system (OS) 122, basic input/output system (BIOS) or Uniform Extensible Firmware Interface (UEFI) 124, and firmware (F/W) 126. These software and/or firmware modules have varying functionality when their corresponding program code is executed by processor subsystem 112 or secondary processing devices within management IHS 100. For example, application(s) 120 may include a word processing application, a presentation application, and a management station application, among other applications.

IHS 100 further includes one or more input/output (I/O) controllers 130 which support connection by and processing of signals from one or more connected input device/s 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a USB, a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removable storage device/s 138, such as a compact disk (CD), digital video disk (DVD), flash drive, or flash memory card. In one or more embodiments, device interface(s) 136 can further include general purpose I/O interfaces such as inter-integrated circuit ($I^2C$), system management bus (SMB), and peripheral component interconnect (PCI) buses.

IHS 100 comprises a network interface controller (NIC) 140. NIC 140 enables IHS 100 and/or components within IHS 100 to communicate and/or interface with other devices, services, and components that are located external to IHS 100. These devices, services, and components can interface with IHS 100 via an external network, such as example network 142, using one or more communication protocols that can include transport control protocol/internet protocol (TCP/IP) and network block device (NBD) protocol. Network 142 can be a local area network, wide area network, personal area network, and the like, and the connection to and/or between network and IHS 100 can be wired, wireless, or a combination thereof. For purposes of discussion, network 142 is indicated as a single collective component for simplicity. However, it should be appreciated that network 142 can comprise one or more direct connections to other devices as well as a more complex set of interconnections as can exist within a wide area network, such as the Internet.

The symmetry of the symmetrical arrangement 106 of the circuit board assembly 102 is referenced to the adjacent pair of signal vias 110*a*-110*b* that carry a differential communication signal through the PCB substrates 104. The signal vias 110*a*-110*b* define a bisecting plane 144 orthogonal to the PCB substrates 104. The bisecting plane 144 extends through the adjacent pair of signal vias 110a-110b. The adjacent pair of signal vias 110a-110b also defines a virtual ground plane 146 that orthogonally intersects the bisecting plane 144 at a point that is substantially equidistant from the pair of adjacent signal vias 110a-110b. The virtual ground plane 146 orthogonally intersects the PCB substrates 104. The adjacent pair of signal vias 110a-110b transmit a differential signal that is transmitted or received from a high communication speed functional component 158.

To determine annular spacing of the ground vias 108a-108b, a pair of reference points 148a-148b are defined on the virtual ground plane 146 at an identical radius R from both signal vias 110a-110b. Signal via 110a is radially spaced by identical radius R from both first ground vias 108a. Signal via 110b is radially spaced by identical radius R from both second ground vias 108b. The annular spacing from reference point 148a to the nearest first ground via 108a is θ°. The annular spacing between first ground vias 108a is θ°. The annular spacing from reference point 148b to the nearest first ground via 108a is θ°. Similarly, the annular spacing from reference point 148a to the nearest second ground via 108b is θ°. The annular spacing between second ground vias 108a is θ°. The annular spacing from reference point 148b to the nearest second ground via 108b is θ°.

The stack of PCB substrates 104 has a top surface 150 and a bottom surface 152 to which are respectively attached a top ground plane 154 and a bottom ground plane 156. For clarity, the top and bottom surfaces 150, 152 are shown exposed in the stack of PCT substrates 104; However, either of the top and bottom ground planes 154, 156 can be buried within the stack of PCT substrates 104. The pairs of ground vias 108a-108b are electrically connected between the top and bottom ground planes 154, 156 to provide a return current path.

For clarity, two pairs of ground vias 108a-108b are shown in FIG. 1. One or more numbers of pairs of ground vias 108a-108b can be incorporated for an estimated signal integrity requirement according to aspects of the present disclosure. In addition, identical annular and radial distances are described; however, benefits of the present disclosure extend to substantially identical arrangements. One or more embodiments can roughly or approximately position a pair of vias such that the annular and radial distances are within a small delta (e.g., 10% range) of each other. For purposes of the disclosure, the terms substantially identical or substantially equal/equidistant are intended to include these arrangements as well.

Figure 2:
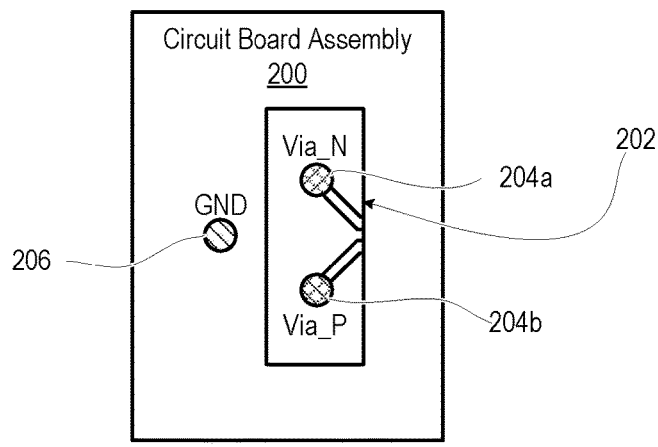
FIG. 2 illustrates a top view of an example circuit board assembly having an adjacent pair of vias that carry a differential communication signal having a return current path provided by one ground via, according to one or more embodiments.
Figure 3:
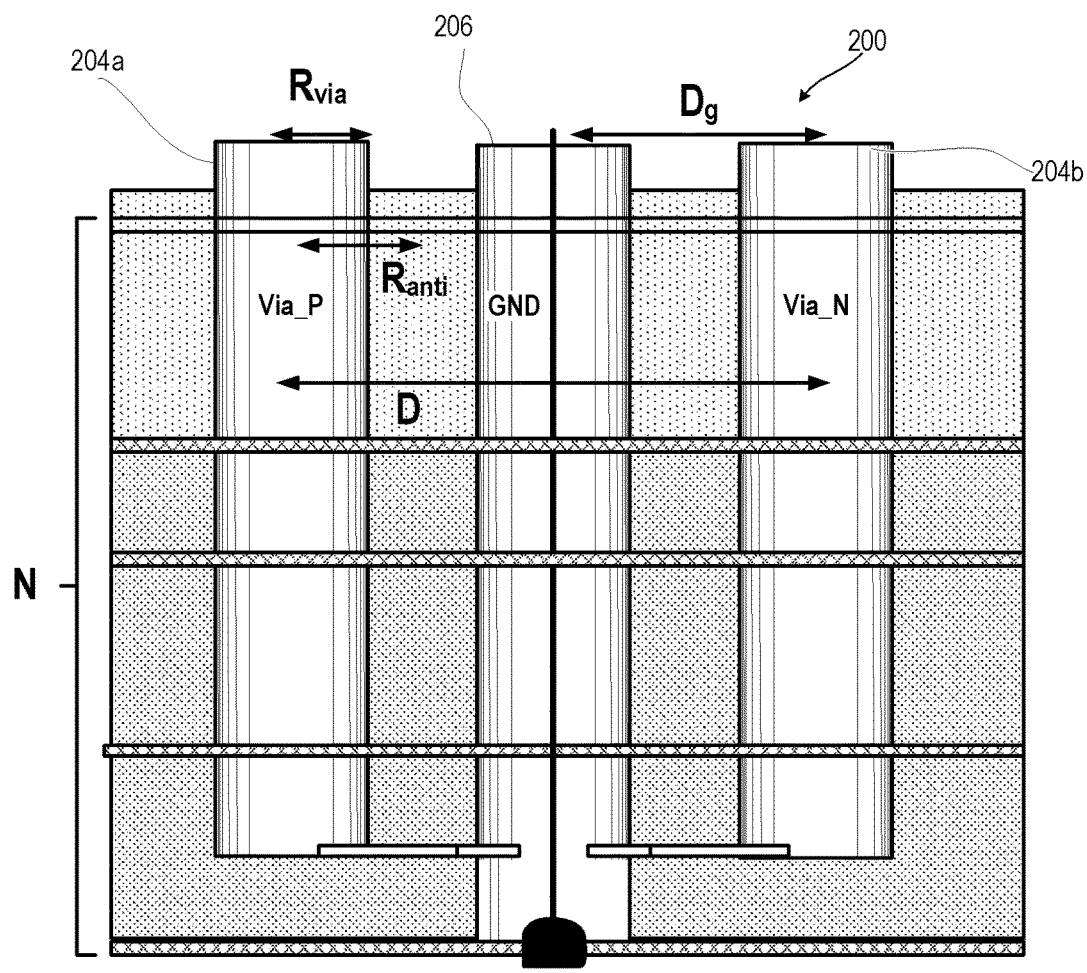
FIG. 3 illustrates a side cutaway view of the example circuit board assembly of FIG. 2, according to one or more embodiments.

FIGS. 2-3 illustrate an example circuit board assembly 200 having an arrangement 202 of adjacent pair of signal vias 204a-204b (Via_N, Via_P) that carry a differential communication signal having a return current path provided by at least one ground via 206. Differential signaling is a method for electrically transmitting information using two complementary signals that are referred herein as a differential signal. The technique sends the same electrical signal as a differential pair of signals, each in a dedicated conductor. The pair of conductors can be wires (typically twisted together) or traces on a circuit board. The receiving circuit responds to the electrical difference between the two signals, rather than the difference between a single wire and ground. The opposite technique is called single-ended signaling. Provided that the source and receiver impedances in the differential signaling circuit are equal, external electromagnetic interference tends to affect both conductors identically. Since the receiving circuit only detects the difference between the wires, the technique resists electromagnetic noise compared to single-ended signaling configuration using one conductor with an un-paired reference (ground). The technique works for both analog signaling, as in balanced audio, and digital signaling, as in RS-422, RS-485, Ethernet over twisted pair, peripheral component interconnect (PCI) Express, DisplayPort, high-definition multimedia interface (HDMI), and universal serial bus (USB).

In printed circuit board design, a via consists of two pads, in corresponding positions on different layers of the board, that are electrically connected by a hole through the board. The hole is made conductive by electroplating, or is lined with a tube or a rivet. High-density multi-layer PCBs may have microvias. Basic steps of making PCB is repetition of layer stacking, through drilling of stacked layer, and plating with copper trace patterning using photolithography and etching.

With continuing reference to FIGS. 2-3, analyses were performed in developing and validating the present disclosure by varying the number of ground vias from one (1) to seven (7) and varying placement of ground (GND) vias. In general, including more GND vias reduced resonances at high frequencies. However, adding high numbers of GND vias per signal via is not practical due to the consumption of board space and the limitations on forming electrical connections to the increased number of vias.

FIG. 4 illustrates an example arrangement 400 of an adjacent pair of vias 402a-402b with one pair of symmetrically positioned ground vias 404a-404b. This simple version is used to analytically and mathematically prove the cause behind the resonances. A transverse electric (TE) and transverse magnetic (TM) mode of electromagnetic radiation is a particular electromagnetic field pattern of radiation measured in a plane perpendicular (i.e., transverse) to the propagation direction of the beam. Transverse modes occur in radio waves and microwaves confined to a waveguide, and also in light waves in an optical fiber and in a laser's optical resonator. Transverse modes occur because of boundary conditions imposed on the wave by the waveguide. For example, a radio wave in a hollow metal waveguide must have zero tangential electric field amplitude at the walls of the waveguide, so the transverse pattern of the electric field of waves is restricted to those that fit between the walls. For this reason, the modes supported by a waveguide are quantized. The allowed modes can be found by solving Maxwell's equations for the boundary conditions of a given waveguide. At high frequencies, plane pairs can resonate due to a cavity effect as given by the following equation:

$$f_{mn} = \frac{c}{2\pi\sqrt{\mu_r \varepsilon_r}} \sqrt{\left(\frac{(2m-1)\pi}{a}\right)^2 + \left(\frac{n\pi}{b}\right)^2} \qquad \text{Eqn. 1}$$

Resonance frequencies of a square microwave cavity with zero depth for any transverse electrical mode or transverse magnetic resonant mode can be found by Eqn. 1. The portion of the equation under the square root symbol is the wave number. The m and n terms are the mode numbers and a and b being the corresponding dimensions. Term C is the speed of light in vacuum; and $\mu_r$ and $\varepsilon_r$ are relative permeability and permittivity of the cavity filling respectively.

The predicted and simulated results are given in TABLE 1:

TABLE 1

| Predicted by formula | | | | Simulated results |
|---|---|---|---|---|
| $\varepsilon_r$ | m | n | f(GHz) | Marker/f (GHz) |
| 3.4 | 0 | 1 | 8.0 | M1/7.9 |
| 3.4 | 1 | 1 | 11.3 | M2/12.8 |
| 3.4 | 1 | 2 | 17.9 | M3/18.1 |

The present disclosure provides a way to quench the resonance caused by cavity resonance. Given that the signal on the differential lines are 180° out of phase, the virtual ground plane exists between the two signal vias 402a-402b. Using the upper signal via 402a as a center point and given a suitable length as the radius, a circle is created on an upper area with an angle φ. Placing the first ground vias in equal annular spacing divides this angle as given in the following equation:

$$\theta = \frac{\phi}{n/2 + 1} \quad \text{Eqn. 2}$$

The angle "φ" by geometric inspection as annotated in FIG. 4 can be shown to be 240°. The number "n" thus divides this φ=240° into equal portions. Thus, for n=2, θ=240/(2/2+1)=240/2=120. For n=4, θ=240/(4/2+1)=240/3=80. For n=6, θ=240/(6/2+1)=240/4=60.

Placing of the second ground via 402b is achieved in the same manner. For a single pair of first and second ground vias 404a-404b, the spacing is substantially or identically 120°. Analysis indicates that 6 ground vias placed at random locations does not perform as well as the two symmetrically placed ground vias 404a-404b. The placement can be extended to additional symmetric pairs for greater quenching of resonance if required by the communication frequency.

FIG. 5 illustrates an example arrangement 500 of an adjacent pair of vias 502a-502b that carry a differential communication signal having a return current path provided by two pairs of a first ground via 504a and a second ground via 504b. The resulting annular spacing is 80°. FIG. 6 illustrates an example arrangement 600 of an adjacent pair of vias 602a-602b that carry a differential communication signal having a return current path provided by three pairs of a first ground via 604a and a second ground via 604b. The resulting annular spacing is 60°.

In FIGS. 4-6, for clarity the spacing between the two signal vias is the same radial dimension as each signal vias is spaced respectively to the first and second ground vias. The result is the respective 120°, 80°, and 60° annular spacing. It should be appreciated that aspects of the present innovation apply to a different spacing between the two signal vias relative to the radius to the respective first and second ground vias.

Figure 7:
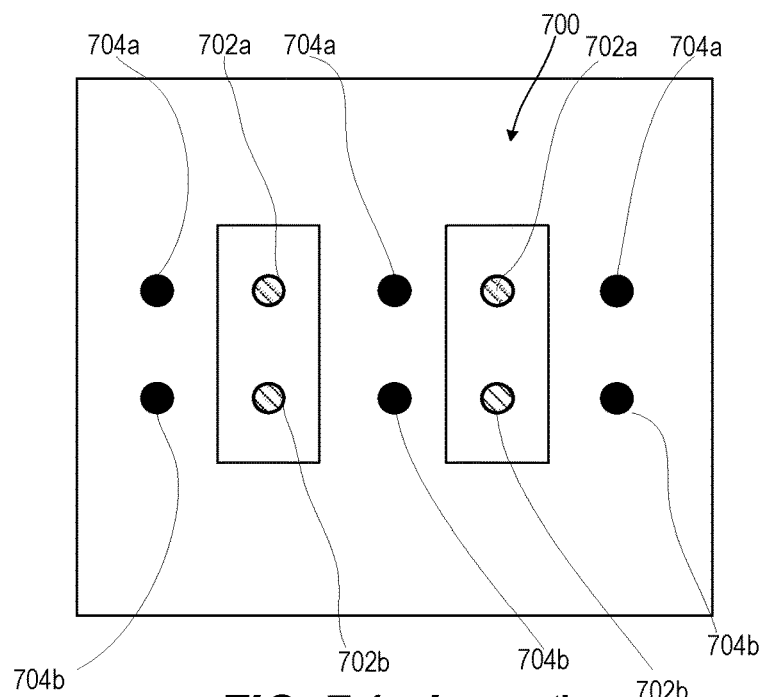
FIG. 7 illustrates a top view of a generally-known arrangement of two pairs of signal vias differentially placed return current path provided by ground vias.
Figure 8:
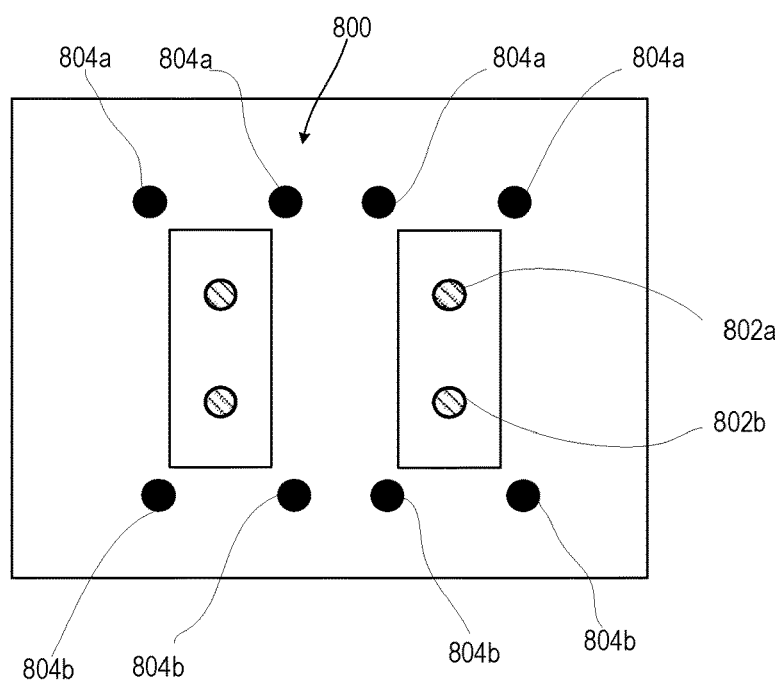
FIG. 8 illustrates an example arrangement of two pairs of signal vias symmetrically placed return current path provided respectively by two pairs of ground vias, according to one or more embodiments.

In addition to improving signal performance of high-speed differential pairs, the present innovation also helps in lowering crosstalk between two differential lines. FIG. 7 illustrates a generally-known arrangement 700 of two pairs of signal vias 702a-702b and a differentially placed return current path provided by a respective pair of ground vias 704a-704b that are placed in direct alignment. The close proximity and interposed relationship is generally believed to reduce crosstalk. In contrast, FIG. 8 illustrates an example arrangement 800 of two pairs of signal vias 802a-802b and symmetrically placed return current path provided respectively by two pairs of a first ground via 804a and a second ground via 804b, according to one embodiment of the disclosure.

Figure 9:
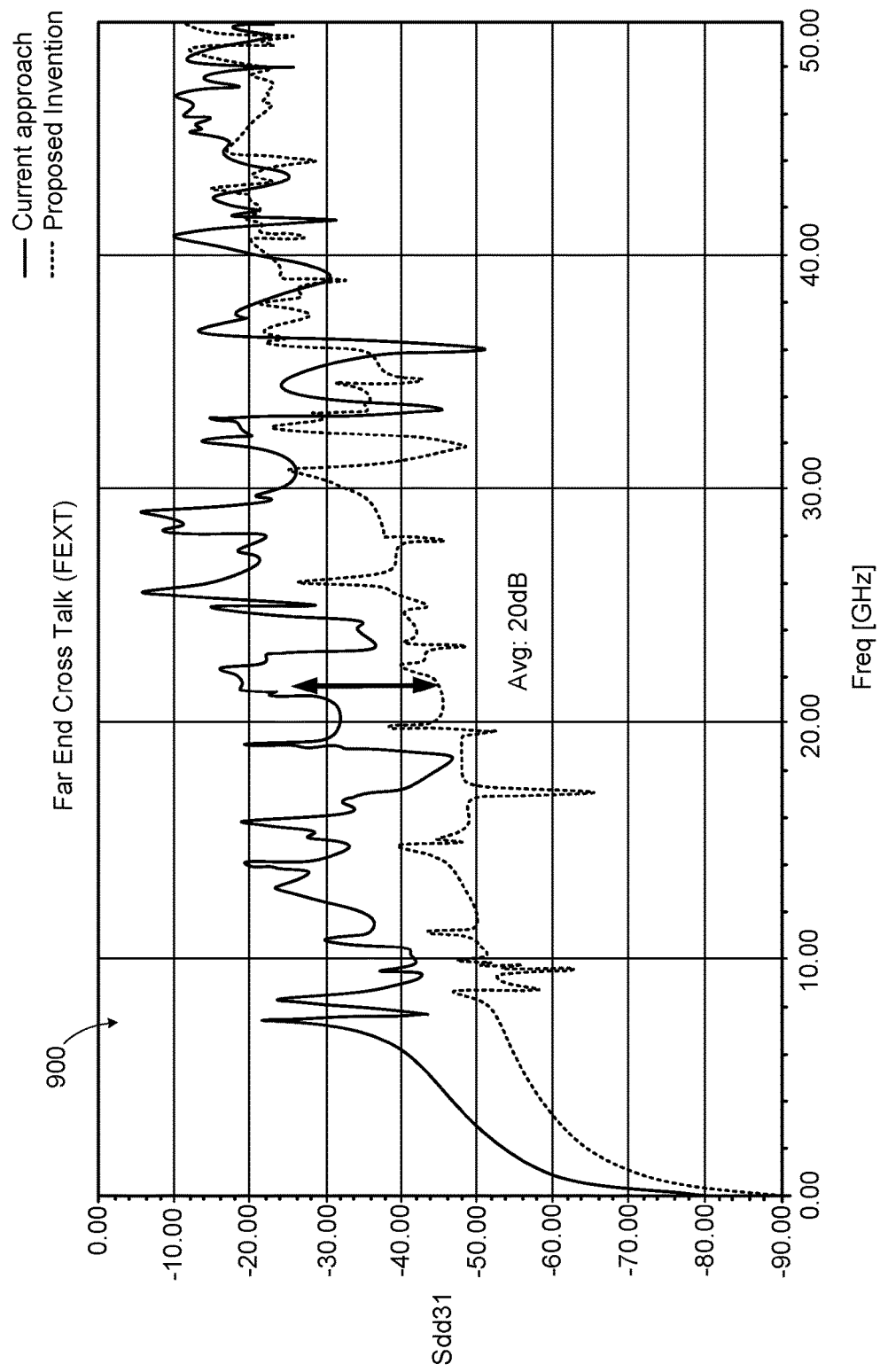
FIG. 9 illustrates a graphical plot comparison of far end cross talk (FEXT) as a function of frequency by the arrangements of FIGS. 7-8, according to one or more embodiments.
Figure 10:
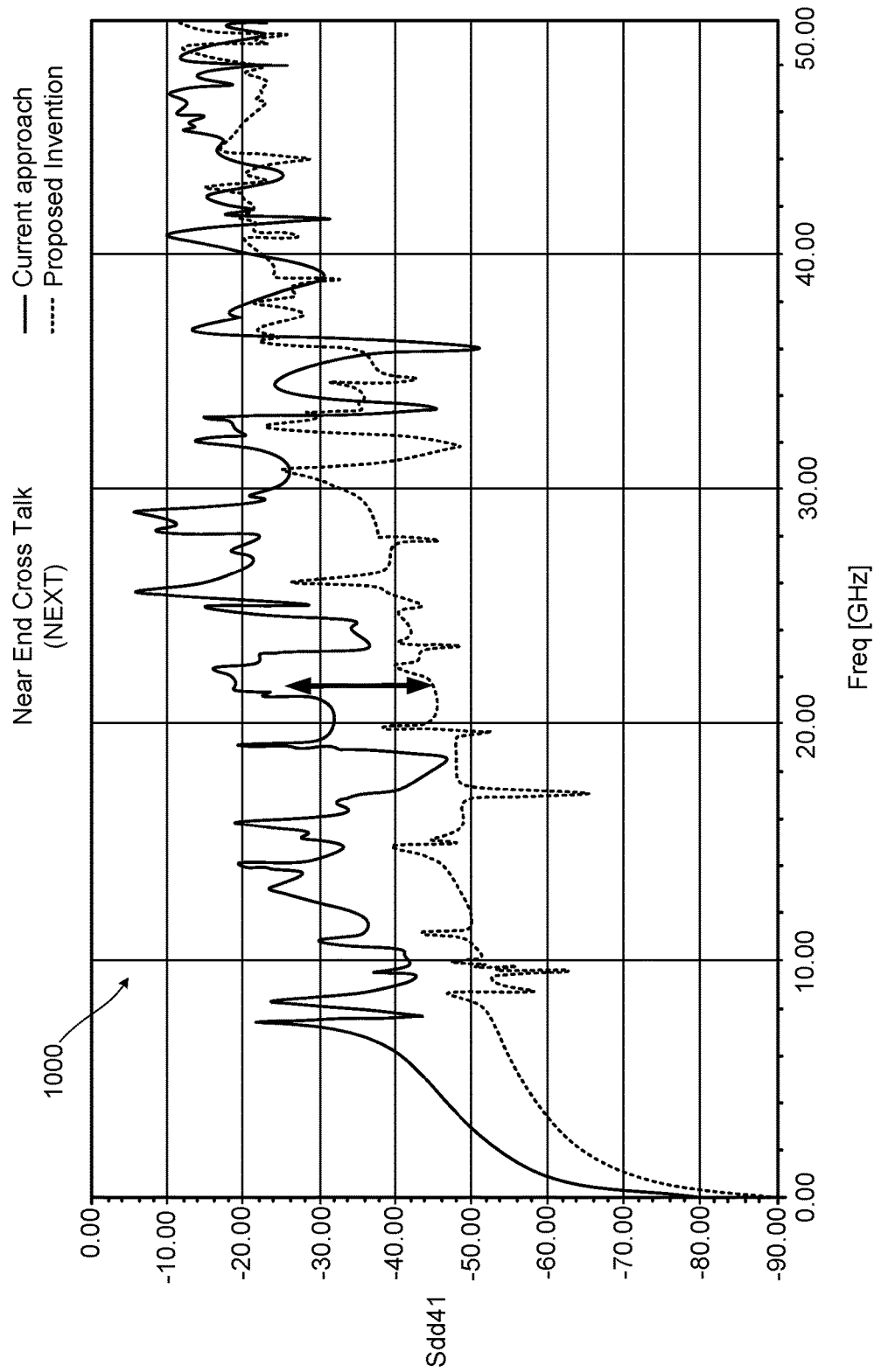
FIG. 10 illustrates a graphical plot comparison of near end cross talk (NEXT) as a function of frequency by the arrangements of FIGS. 7-8, according to one or more embodiments.

Analysis was performed and plotted for crosstalk as a function of frequency expected for both of arrangements 700, 800. In electronics, crosstalk is any phenomenon by which a signal transmitted on one circuit or channel of a transmission system creates an undesired effect in another circuit or channel. Crosstalk is usually caused by undesired capacitive, inductive, or conductive coupling from one circuit, part of a circuit, or channel, to another. FIG. 9 illustrates a graphical plot comparison 900 of far end cross talk (FEXT) as a function of frequency by the arrangements 700, 800 of FIGS. 7 and 8 respectively. FIG. 10 illustrates a graphical plot comparison 1000 of near end cross talk (NEXT) as a function of frequency by the arrangements 700, 800 of FIGS. 7 and 8 respectively. Both graphical plot comparisons 900, 1000 indicate a 20 dB improvement by using the symmetric arrangement 800.

Figure 11:
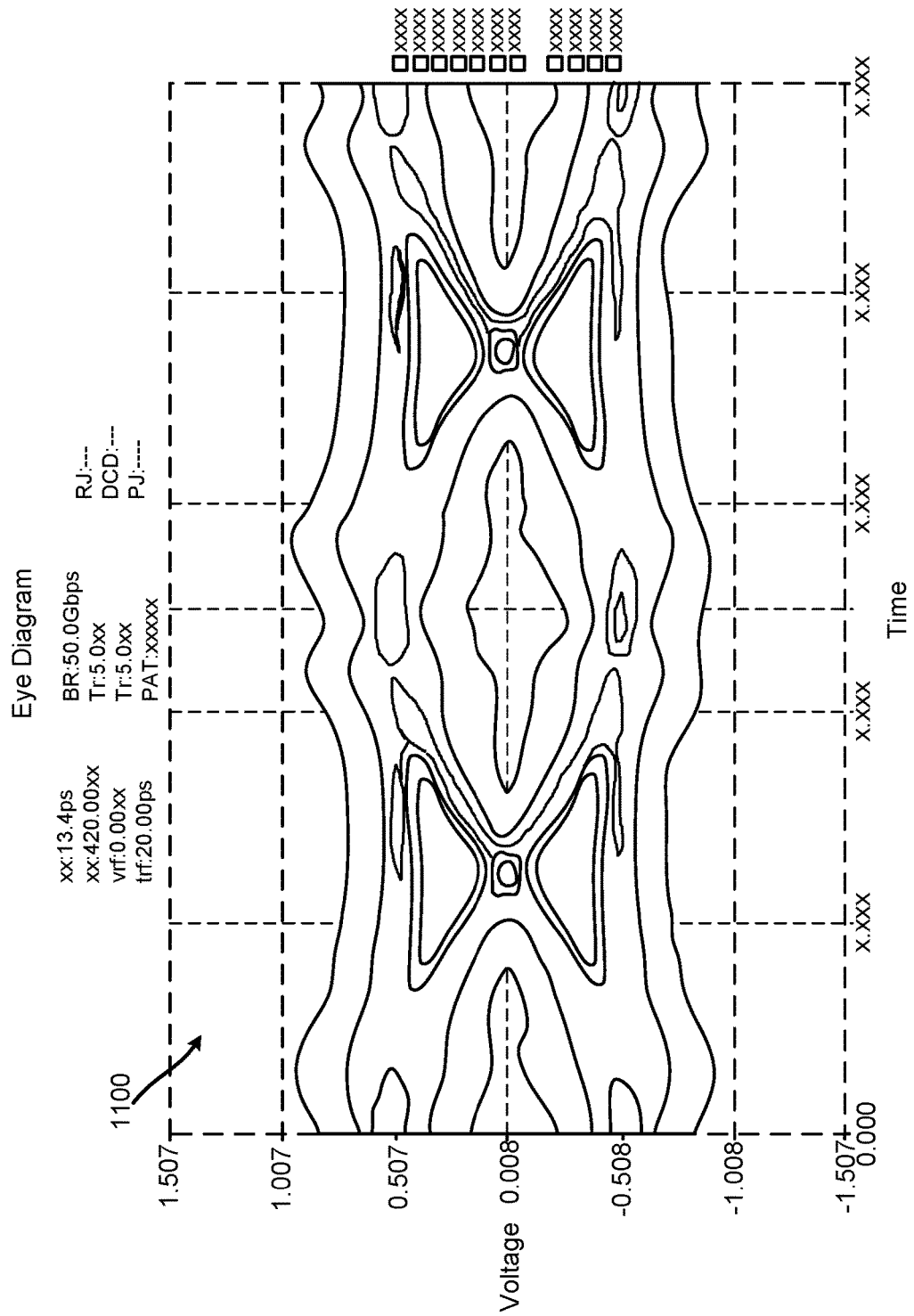
FIG. 11 illustrates a graphical eye diagram based on an analysis of the generally-known arrangement of FIG. 8.
Figure 12:
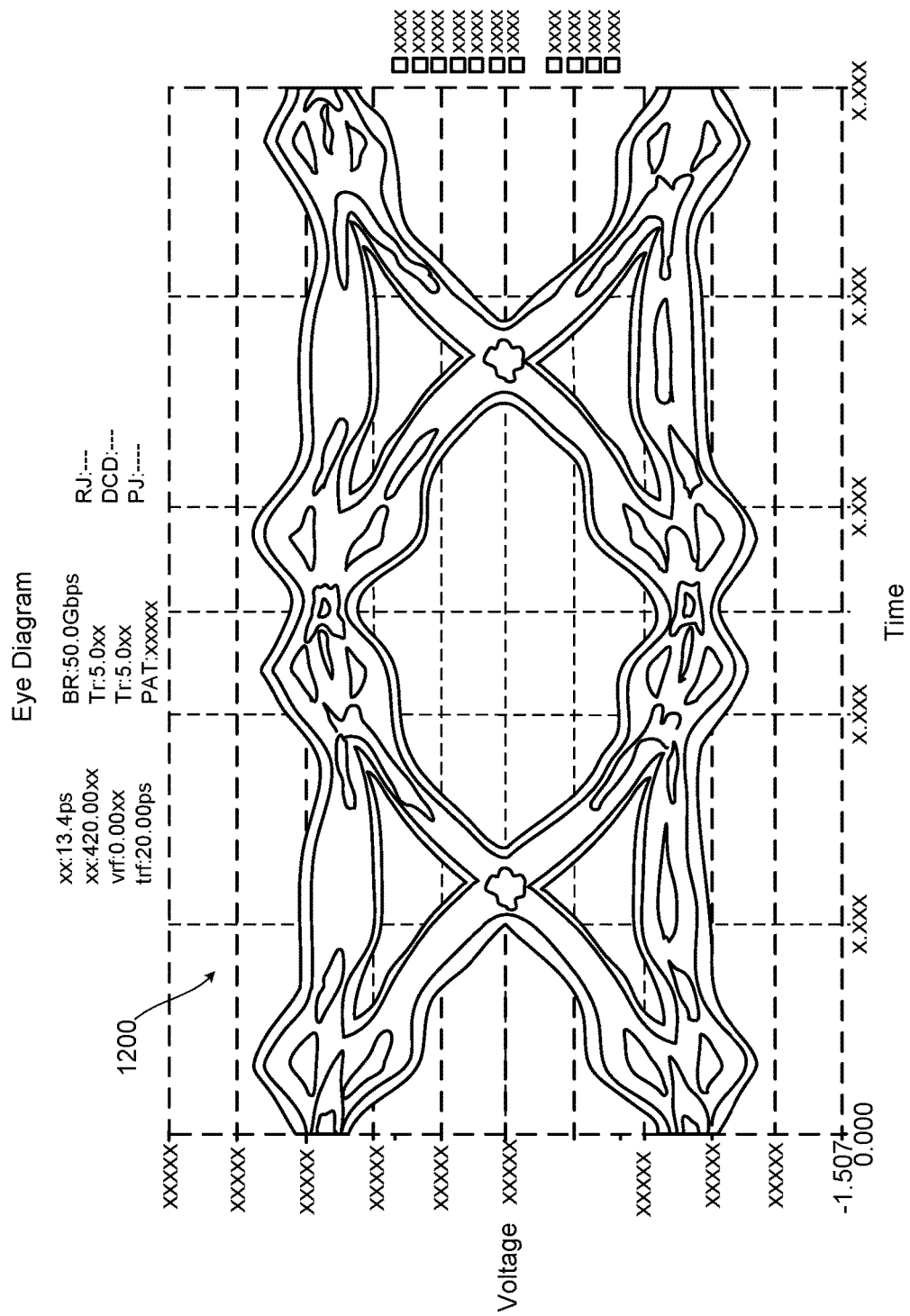
FIG. 12 illustrates a graphical eye diagram based on an analysis of the example arrangement of FIG. 9, according to one or more embodiments.

FIG. 11 illustrates a graphical eye diagram 1100 of the generally-known arrangement 700 of FIG. 7 used on 50 Gbps bus channels. FIG. 12 illustrates a graphical eye diagram 1200 of the example arrangement 800 of FIG. 8 also used on 50 Gbps bus channels. The much larger eye of symmetric arrangement 800 (FIG. 8) in the graphical eye diagram 1200 indicates much improved signal integrity and resistance to crosstalk.

Figure 13:
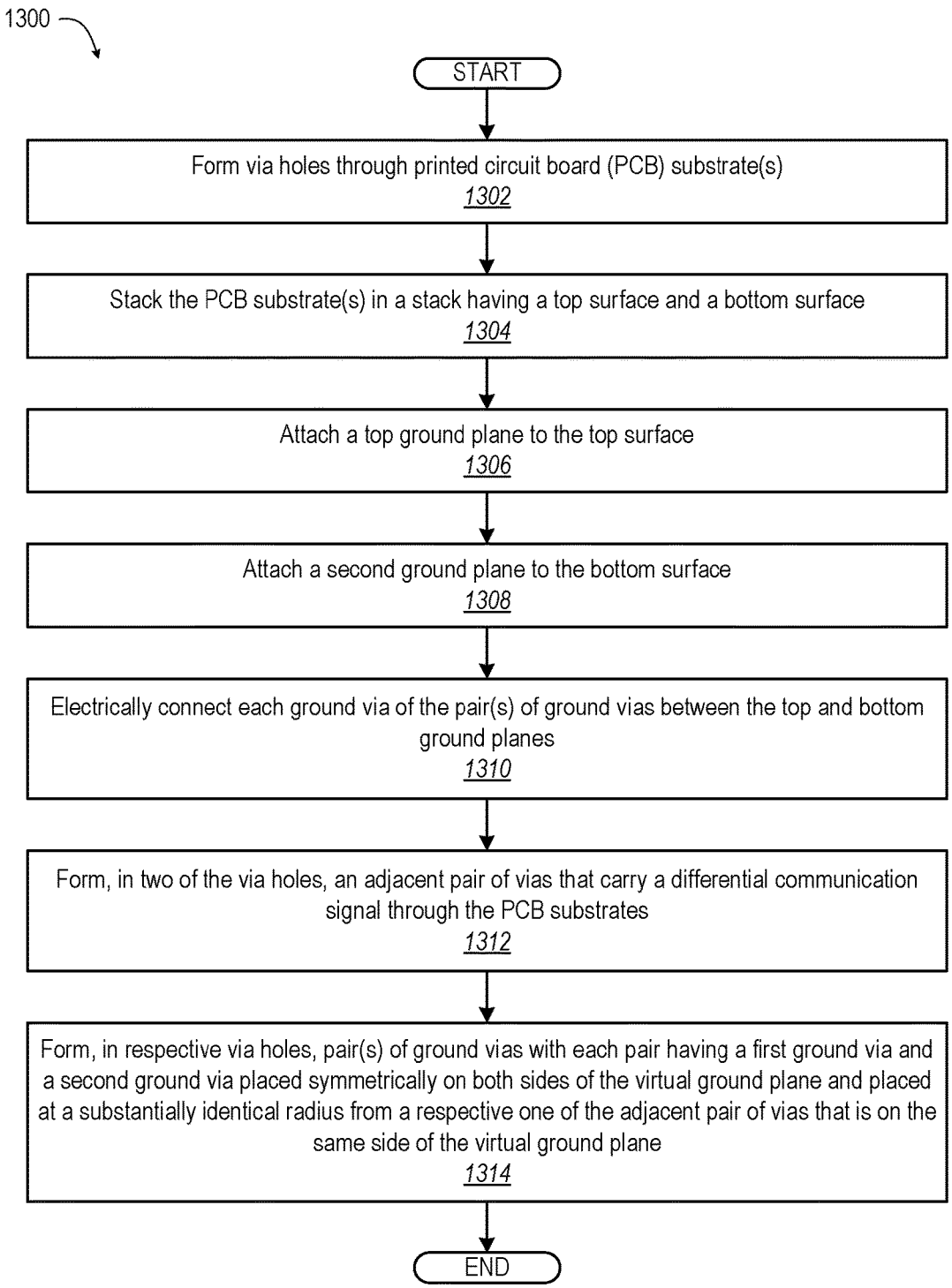
FIG. 13 illustrates a flow diagram of a method of making a circuit board of an IHS that improves signal integrity of differential signal vias, according to one or more embodiments.
Figure 14:
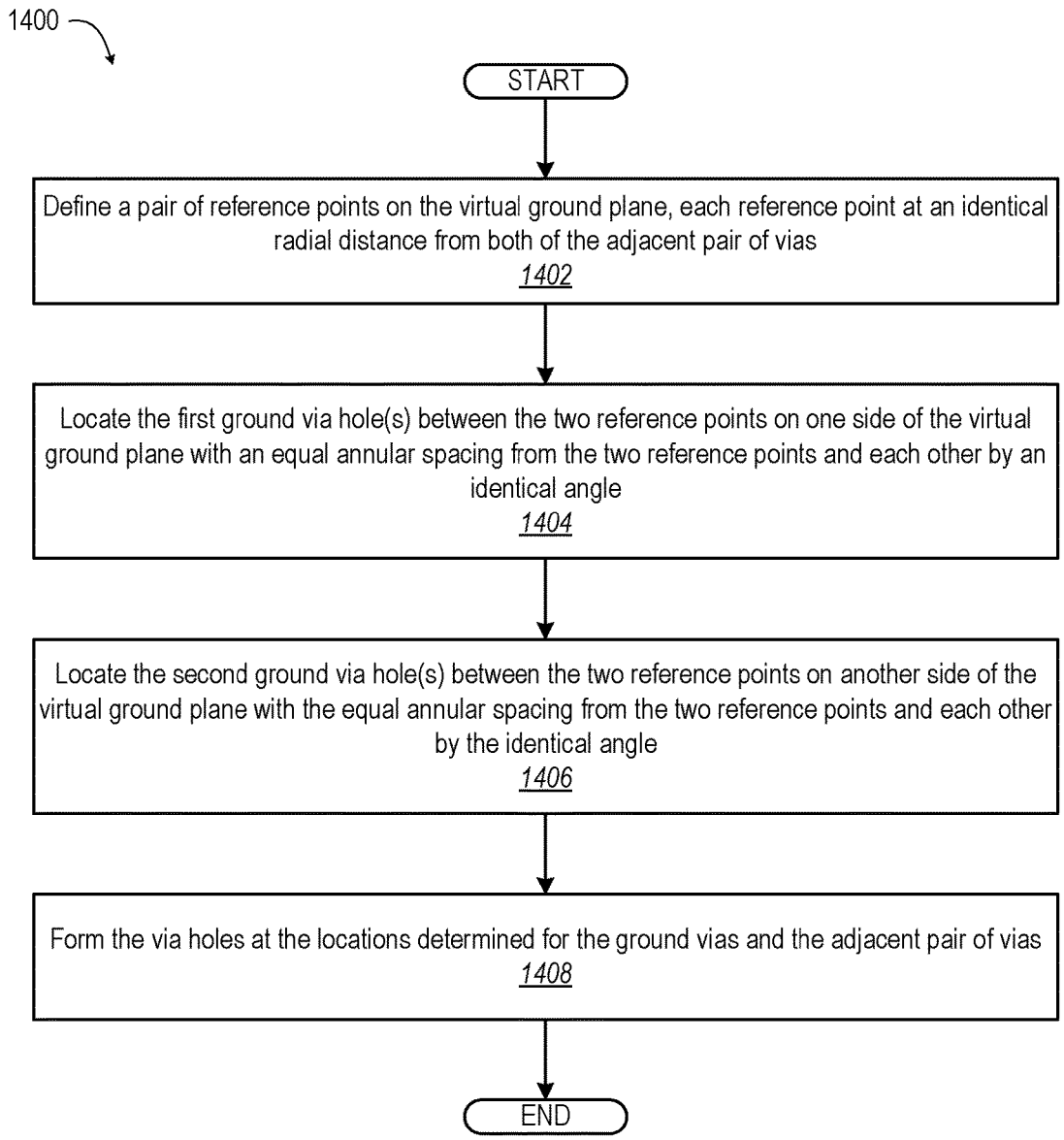
FIG. 14 illustrates a flow diagram of a method of optimized placement of ground vias for enhanced signal integrity, according to one or more embodiments.

FIGS. 13-14 illustrate flowcharts of exemplary methods 1300, 1400 by which an automated manufacturing system 108a-108b (FIG. 1) and/or an IHS 100 (FIG. 1) performs different aspects of the processes that enable the one or more embodiments of the disclosure. Generally, methods 1300, 1400 represent computer-implemented methods. The description of methods 1300, 1400 are provided with general reference to the specific components illustrated within FIG. 1.

FIG. 13 illustrates method 1300 of making a circuit board assembly of an IHS that improves signal integrity of differential signal vias by placement of the ground vias. Signal integrity is improved by placing pairs of ground vias symmetrically and annularly spaced with respect to a ground plane between a pair of signal vias. Method 1300 begins with forming via holes through printed circuit board (PCB) substrate(s) (block 1302). The automated manufacturing system stacks the PCB substrate(s) in a stack having a top surface and a bottom surface (block 1304). Method 1300 includes attaching a top ground plane to the top surface (block 1306). Method 1300 includes attaching a second ground plane to the bottom surface (block 1308). Method 1300 includes electrically connecting each ground via of the pair(s) of ground vias between the top and bottom ground planes (block 1310). The automated manufacturing system forms, in two of the via holes, an adjacent pair of vias that carry a differential communication signal through the PCB substrates (block 1312). The adjacent pair of vias defines: (i) an axis; (ii) a bisecting plane orthogonal to the PCB substrate(s) and that passes through the axis of the adjacent pair of vias; and (iii) a virtual ground plane orthogonally intersecting the bisecting plane at a point that is substantially equidistant to each of the pair of adjacent vias. The virtual ground plane is orthogonal to the more than one PCB substrate. The automated manufacturing system forms, in respective via holes, pair(s) of ground vias. Each pair has a first ground via and a second ground via placed symmetrically on both sides of the virtual ground plane and placed at an identical radius from a respective one of the adjacent pair of vias that is on the same side of the virtual ground plane (block 1314). The first ground via(s) are annularly spaced from each other and from a pair of reference points on the virtual ground plane. The reference points are each radially spaced from both of the adjacent pair of vias by the identical radius, and the one or more second ground vias are annularly spaced from each other and the pair of reference points. Then method 1300 ends.

FIG. 14 illustrates an exemplary method 1400 for placement of ground vias for enhanced signal integrity. In one or more embodiments, method 1400 begins by locating an adjacent pair of vias that define: (i) an axis; (ii) a bisecting plane orthogonal to the PCB substrate(s) and that passes through the axis of the adjacent pair of vias; and (iii) a virtual ground plane orthogonally intersecting the bisecting plane at a point that is substantially equidistant to each of the pair of adjacent vias. The virtual ground plane is orthogonal to the more than one PCB substrate (block 1402). The automated manufacturing system defines a pair of reference points on the virtual ground plane, each reference point at an identical radial distance from both of the adjacent pair of vias (block 1404). The method 1400 places half of the ground vias on a first side of the virtual ground plane and another half of the ground vias symmetrically on the other side of the virtual ground plane. The symmetric two ground vias are referred herein as a first ground via and a second ground via of a pair of ground vias. Consequently, one or more first ground vias of the pair(s) of ground vias are on a first side of the virtual ground plane. One or more second ground vias of the pair(s) of ground vias are on a second side of the virtual ground plane in a symmetric arrangement. In particular, for a given number of pairs of ground vias, method 1400 locates the first ground via hole(s) between the two reference points on one side of the virtual ground plane with an equal annular spacing from the two reference points and from each other first ground via hole by an identical angle (block 1406). The automated manufacturing system locates the second ground via hole(s) between the two reference points on another side of the virtual ground plane with the equal annular spacing from the two reference points and from each other second ground via hole by the identical angle (block 1408). Method 1400 includes forming the via holes at the locations determined for the ground vias and the adjacent pair of vias (block 1410). Then method 1400 ends.

In one embodiment, the given number of pairs of ground vias is one. The result is that the pair of ground vias are in linear alignment with, and are on opposing sides of, the adjacent pair of vias. The first and second ground vias are 120° away from the reference points. In another embodiment, the given number of pairs of ground vias is two. The result is that the annular spacing from the two reference points and between the ground vias is 80°. In another embodiment, the given number of pairs of ground vias is three. The result is that the annular spacing from the two reference points and between the ground vias is 60°. It is appreciated that the given number can be four or more, in other embodiments.

Figure 15:
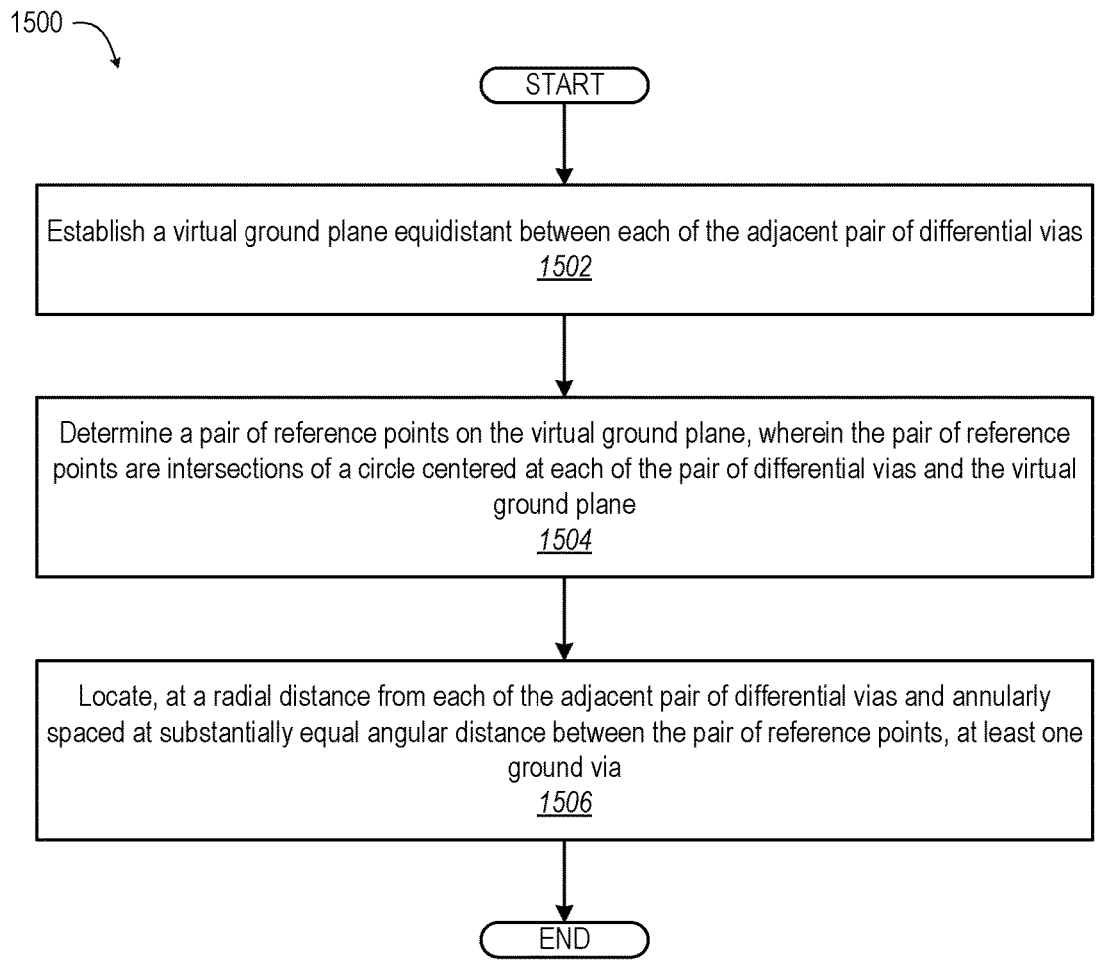
FIG. 15 illustrates a flow diagram of a method of selectively locating at least one pair of ground vias around an adjacent pair of differential vias.

FIG. 15 illustrates a method 1500 of selectively locating at least one pair of ground vias around an adjacent pair of differential vias. In one or more embodiments, the method 1500 includes establishing a virtual ground plane equidistant between each of the adjacent pair of differential vias (block 1502). Method 1500 includes determining a pair of reference points on the virtual ground plane, wherein the pair of reference points are intersections of a circle centered at each of the pair of differential vias and the virtual ground plane (block 1504). Method 1506 includes locating, at a radial distance from each of the adjacent pair of differential vias and annularly spaced at substantially equal angular distance between the pair of reference points, at least one ground via (block 1508).

In one or more embodiments, the radial distance is the radius of the circle centered at each of the pair of differential vias. In one or more embodiments, the method 1500 includes establishing a virtual ground plane further by: (i) defining an axis through the adjacent pair of differential via; and (ii) bisecting the defined axis with an orthogonal plane.

In the above described flow charts of FIGS. 13-15, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A circuit board assembly comprising: more than one printed circuit board (PCB) substrate; an adjacent pair of vias that carry a differential communication signal through the more than one PCB substrate and that define: (i) an axis; (ii) a bisecting plane orthogonal to the more than one PCB substrate and that passes through the axis of the adjacent pair of vias; and (iii) a virtual ground plane orthogonally intersecting the bisecting plane at a point substantially equidistant to each of the pair of adjacent vias and orthogonally to the more than one PCB substrate; and one or more pairs of ground vias, each pair of the one or more pairs having a first ground via and a second ground via placed symmetrically on both sides of the virtual ground plane and placed at a substantially identical radius from a respective one of the adjacent pair of vias that is on the same side of the virtual ground plane, the one or more first ground vias annularly spaced substantially equally from each other and from a pair of reference points on the virtual ground plane, the pair of reference points being each radially spaced from both of the adjacent pair of vias by the substantially identical radius, and the one or more second ground vias annularly spaced from each other and the pair of reference points.

2. The circuit board assembly of claim 1, wherein:
one or more pairs of ground vias are placed at an identical radius from the respective one of the adjacent pair of vias that is on the same side of the virtual ground plane;
the pair of reference points are placed at the identical radius respectively from the adjacent pair of vias;
the one or more first ground vias and the pair of reference points are equally annularly spaced from each other; and
the one or more second ground vias and the pair of reference points are equally annularly spaced from each other.

3. The circuit board assembly of claim 2, wherein the one or more pairs of ground vias comprises one pair of ground vias with a single first and second ground vias in alignment with the bisecting plane and radially spaced 120° from each of the reference points.

4. The circuit board assembly of claim 2, wherein the one or more pairs of ground vias comprises two pair of ground vias having two first ground vias radially spaced from the two reference points and each other by 80° and having two second ground vias spaced from the two reference points and each other by 80°.

5. The circuit board assembly of claim 2, wherein the one or more pairs of ground vias comprises three pairs of ground vias having three first ground vias radially spaced from the two reference points and each other by 60° and having three second ground vias spaced from the two reference points and each other by 60°.

6. The circuit board assembly of claim 1, further comprising a top ground plane and a bottom ground plane, wherein each ground via of the one or more pairs of ground vias are electrically connected between the top and bottom ground planes.

7. An information handling system (IHS) comprising:
a circuit board assembly comprising:
more than one printed circuit board (PCB) substrate;
an adjacent pair of vias that carry a differential communication signal through the more than one PCB substrate and that define: (i) an axis; (ii) a bisecting plane orthogonal to the more than one PCB substrate and that passes through the axis of the adjacent pair of vias; and (iii) a virtual ground plane orthogonally intersecting the bisecting plane at a point equidistant to each of the pair of adjacent vias and orthogonally to the more than one PCB substrate;
one or more pairs of ground vias, each pair of the one or more pairs having a first ground via and a second ground via placed symmetrically on both sides of the virtual ground plane and placed at a substantially identical radius from a respective one of the adjacent pair of vias that is on the same side of the virtual ground plane, the one or more first ground vias annularly spaced from each other and from a pair of reference points on the virtual ground plane that are each radially spaced from both of the adjacent pair of vias by the identical radius, and the one or more second ground vias annularly spaced from each other and the pair of reference points; and
a functional component electrically coupled to the adjacent pair of vias that is capable of performing at least one of: (i) transmit; and (ii) receive the differential communication signal.

8. The IHS of claim 7, wherein:
one or more pairs of ground vias are placed at an identical radius from the respective one of the adjacent pair of vias that is on the same side of the virtual ground plane,
the pair of reference points are placed at the identical radius respectively from the adjacent pair of vias;
the one or more first ground vias and the pair of reference points are equally annularly from each other; and
the one or more second ground vias and the pair of reference points are equally annularly from each other.

9. The IHS of claim 8, wherein the one or more pairs of ground vias comprises one pair of ground vias with a single first and second ground vias in alignment with the bisecting plane and radially spaced 120° from each of the reference points.

10. The IHS of claim 8, wherein the one or more pairs of ground vias comprises two pair of ground vias having two first ground vias radially spaced from the two reference points and each other by 80° and having two second ground vias spaced from the two reference points and each other by 80°.

11. The IHS of claim 8, wherein the one or more pairs of ground vias comprises three pair of ground vias having three first ground vias radially spaced from the two reference points and each other by 60° and having three second ground vias spaced from the two reference points and each other by 60°.

12. The IHS of claim 7, further comprising a top ground plane and a bottom ground plane, wherein each ground via of the one or more pairs of ground vias are electrically connected between the top and bottom ground planes.

13. A method comprising:
forming via holes through more than one printed circuit board (PCB) substrate;
stacking the more than one PCB substrates in a stack having a top surface and a bottom surface;
forming, in two of the via holes, an adjacent pair of vias that carry a differential communication signal through the more than one PCB substrate and which defines: (i) an axis; (ii) a bisecting plane orthogonal to the more than one PCB substrate and that passes through the axis of the adjacent pair of vias; and (iii) a virtual ground plane orthogonally intersecting the bisecting plane at a point equidistant to each of the pair of adjacent vias and orthogonally to the more than one PCB substrate; and
forming, in respective via holes, one or more pairs of ground vias, each pair of the one or more pairs having a first ground via and a second ground via placed symmetrically on both sides of the virtual ground plane and placed at a substantially identical radius from a respective one of the adjacent pair of vias that is on the same side of the virtual ground plane, the one or more first ground vias annularly spaced from each other and from a pair of reference points on the virtual ground plane that are each radially spaced from both of the adjacent pair of vias by a substantially identical radius, and the one or more second ground vias annularly spaced from each other and the pair of reference points.

14. The method of claim 13, wherein forming the via holes comprises:
forming the one or more first ground via holes annularly spaced from the two reference points and each other by an identical angle;
forming the one or more second ground via holes annularly spaced from the two reference points and each other by an identical angle; and
forming an adjacent pair of via holes having one via hole radially spaced an identical distance from the one or more first ground via holes and the pair of reference points and having another via hole radially spaced the identical distance from the one or more second ground via holes and the pair of reference points.

15. The method of claim 14, wherein the one or more pairs of ground vias comprises one pair of ground vias, the method further comprising:
forming four via holes in alignment with the bisecting plane and having a substantially equal spacing;
forming the one pair of ground vias in the outer two via holes of the four via holes; and
forming the adjacent pair of vias in the inner two via holes of the four via holes.

16. The method of claim 14, wherein:
the one or more pairs of ground vias comprises two pair of ground vias; and
forming the via holes comprises:
forming two first ground via holes annularly spaced from the two reference points and each other by 80°;
forming two second ground via holes annularly spaced from the two reference points and each other by 80°; and
forming an adjacent pair of via holes having one via hole radially spaced an identical distance from the two first ground via holes and the pair of reference points and having another via hole radially spaced the identical distance from the two second ground via holes and the pair of reference points.

17. The method of claim 14, wherein:
the one or more pairs of ground vias comprises three pair of ground vias; and
forming the via holes comprises:
forming three first ground via holes annularly spaced from the two reference points and each other by 60°;
forming three second ground via holes annularly spaced from the two reference points and each other by 60°; and
forming an adjacent pair of via holes having one via hole radially spaced an identical distance from the three first ground via holes and the pair of reference points and having another via hole radially spaced the identical distance from the three second ground via holes and the pair of reference points.

* * * * *